United States Patent
Huang et al.

(10) Patent No.: US 7,023,253 B2
(45) Date of Patent: Apr. 4, 2006

(54) APPARATUS AND METHOD FOR NOISE SENSITIVITY IMPROVEMENT TO A SWITCHING SYSTEM

(75) Inventors: Jian-Rong Huang, Hsinchu (TW); Kuo-Ping Liu, Hsinchu (TW); Kent Huang, Taoyuan (TW); Liang-Pin Tai, Tainan (TW)

(73) Assignee: Richtek Technology Corp., Hsinchu (TW)

( * ) Notice: Subject to any disclaimer, the term of this patent is extended or adjusted under 35 U.S.C. 154(b) by 21 days.

(21) Appl. No.: 10/882,159

(22) Filed: Jul. 2, 2004

(65) Prior Publication Data

US 2005/0017767 A1   Jan. 27, 2005

(30) Foreign Application Priority Data

Jul. 22, 2003   (TW) .............................. 92120021 A

(51) Int. Cl.
*H03K 5/00*   (2006.01)

(52) U.S. Cl. ....................................... 327/172; 327/551
(58) Field of Classification Search ........ 327/551–559, 327/172–176
See application file for complete search history.

(56) References Cited

U.S. PATENT DOCUMENTS

| 6,166,928 A | * | 12/2000 | Chandorkar | ................. 363/34 |
| 6,300,825 B1 | * | 10/2001 | Dijkmans et al. | ............. 330/10 |
| 2002/0058487 A1 | * | 5/2002 | Takeuchi | .................... 455/260 |

* cited by examiner

*Primary Examiner*—Dinh T. Le
(74) *Attorney, Agent, or Firm*—Rosenberg, Klein & Lee

(57) ABSTRACT

In a noise sensitivity improved switching system and method thereof, comprised sensing the output voltage of the switching system to generate a feedback signal, respectively amplifying the feedback signal by two gains to generate two signals in phase or out of phase, filtering one of the two amplified signals, and summing or comparing the filtered signal and the other one, thereby reducing the noise interference to the switching system.

15 Claims, 16 Drawing Sheets

US 7,023,253 B2

APPARATUS AND METHOD FOR NOISE SENSITIVITY IMPROVEMENT TO A SWITCHING SYSTEM

FIELD OF THE INVENTION

The present invention relates generally to a switching system and more particularly, to an apparatus and method for noise sensitivity improvement to a switching system.

BACKGROUND OF THE INVENTION

The conventional fixed-frequency pulse width modulation (PWM) controller has poor transient response. Recently, people devote to develop variable-frequency PWM controller system to overcome this issue. For the ultra-fast transient response characteristic, however, the output capacitor of a variable-frequency PWM controller system is smaller than that of a fixed-frequency PWM controller system, and another problem, noise sensitivity, is introduced eventually. The popular variable-frequency PWM controller senses the ripple of the output voltage of the switching system to be a ramp to compare with a reference so as for its system control. For example, as shown in FIG. 1, a switching system 10 comprises an error amplifier 102, a constant on-time circuit 104, two drivers 106 and 108, an output stage 110, and a voltage sense circuit 112, among which the output stage 110 includes a high-side switch SW1 connected between a supply voltage VDD and a phase node 114, a low-side switch SW2 connected between the phase node 114 and ground GND, an inductor L connected between the phase node 114 and the output Vout, and an output capacitor C having an equivalent series resistance (ESR) $R_{ESR}$ connected between the output Vout and ground GND. The voltage sense circuit 112 senses the output voltage Vout to generate a feedback signal FB, the error amplifier 102 receives the feedback signal FB to compare with a reference $V_{REF}$ to generate a signal PM, and the constant on-time circuit 104 controlled by the signal PM generates an on-time signal $T_{on}$ for the drivers 106 and 108 to drive the switches SW1 and SW2, such that an inductor current $I_L$ is generated to charge the capacitor C through the inductor L to provide the output voltage Vout to a load $R_L$. As the feedback signal FB is lower than the reference $V_{REF}$, it will trigger a constant on time to the driving signal UG for the high-side switch SW1 by the constant on-time circuit 104. Following the falling edge of the on time duty, a minimum off time is triggered to keep the system stable. Responsive to a load transient, the output voltage Vout will drop a value equal to the product of $R_{ESR}$ and $I_L$ instantly, and this voltage drop will apply to the error amplifier 102, such that the driving signal UG turns on in the shortest response time. The topology has fast transient response, but induces noise sensitivity problem.

FIG. 2 shows a timing diagram of various signals in the circuit 10 of FIG. 1 during a load transient, in which waveform 202 represents the inductor current $I_L$, waveform 204 represents the feedback signal FB, waveform 206 represents the reference $V_{REF}$, waveform 208 represents the signal PM, waveform 210 represents the on-time signal $T_{on}$, waveform 212 represents the minimum off-time signal $T_{offmin}$, and waveform 214 represents the driving signal UG generated by the driver 106. At time t, a load transient is occurred, and thereby the inductor current $I_L$ begins to increase. As a result, the output voltage Vout drops rapidly, and eventually, the feedback signal FB also drops rapidly. By the error amplifier 102, the duty of the signal PM is enlarged, and by which the constant on-time circuit 104 increases the frequency of the on-time signal $T_{on}$, the frequency of the driving signal UG is increased accordingly, such that the high-side switch SW1 is switched more frequently to recover the output voltage Vout to its original level as soon as possible. However, in reality, the feedback signal FB involves high-frequency noise, as shown in FIG. 3 by waveform 204 indicated by noisy portions 218 and 220 for example. Moreover, to achieve fast transient response, the variable-frequency PWM system 10 uses the output capacitor C much smaller than that in a fixed-frequency PWM system, and thus the system becomes more sensitive to noise. When the noise near the valley of the waveform 204 is so large to pull the feedback signal FB lower than the reference $V_{REF}$, error operation may occurred. For example, as shown in the portion 220, the high-frequency noise near a valley of the waveform 204 is large enough for the feedback signal FB lower than the reference $V_{REF}$ incorrectly, resulting in error operation or malfunction of the system 10, as shown in the driving signal UG corresponding to the portion 220.

Therefore, it is desired an apparatus and method for noise sensitivity improvement and fast transient response for a switching system.

SUMMARY OF THE INVENTION

One object of the present invention is to provide an apparatus and method for noise sensitivity improvement to a switching system.

Another object of the present invention is to provide an ultra-fast response and low noise-sensitive switching system.

A noise sensitivity improved switching system according to the present invention comprises generating a feedback signal by sensing the output voltage of the switching system, respectively amplifying the feedback signal by two gains to generate two signals in phase or out of phase, filtering one of the two amplified signals by a filter, and combining the filtered signal and the other one to reduce the noise interference to the switching system.

From one aspect of the present invention, the switching system comprises a voltage sense circuit to sense the output voltage of the switching system to generate the feedback signal, an apparatus for noise sensitivity improvement to the switching system to receive the feedback signal and to generate a combined signal, a comparator to compare the combined signal with a reference to generate a comparator signal, and an output stage to generate the output voltage according to the comparator signal, among which the apparatus for noise sensitivity improvement to the switching system includes an amplifier having a first gain to amplify the feedback signal to generate a first signal, another amplifier having a second gain to amplify the feedback signal to generate a second signal in phase to the first signal, a filter to filter the second signal, and a summing circuit to combine the first signal and the filtered second signal to generate the combined signal to the comparator. As a result, the effective noise in the combined signal is level shifted to higher, thereby reducing its interference to the switching system.

From another aspect of the present invention, the switching system comprises a voltage sense circuit to sense the output voltage of the switching system to generate the feedback signal, an apparatus for noise sensitivity improvement to the switching system to receive the feedback signal and to generate two signals that are compared by a comparator to generate a comparator signal, and an output stage to generate the output voltage according to the comparator signal, among which the apparatus for noise sensitivity improvement to the switching system includes an amplifier circuit to respectively amplify the differential of the feedback signal and a reference by a first gain and by a second gain to generate two amplified signals out of phase to each other to the comparator, a filter to filter one of the two amplified signals, and a voltage generator to provide a reference for level shifting of the two amplified signals.

The apparatus and method according to the present invention is applicable to variable-frequency switching system for both fast transient response and noise sensitivity improvement.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
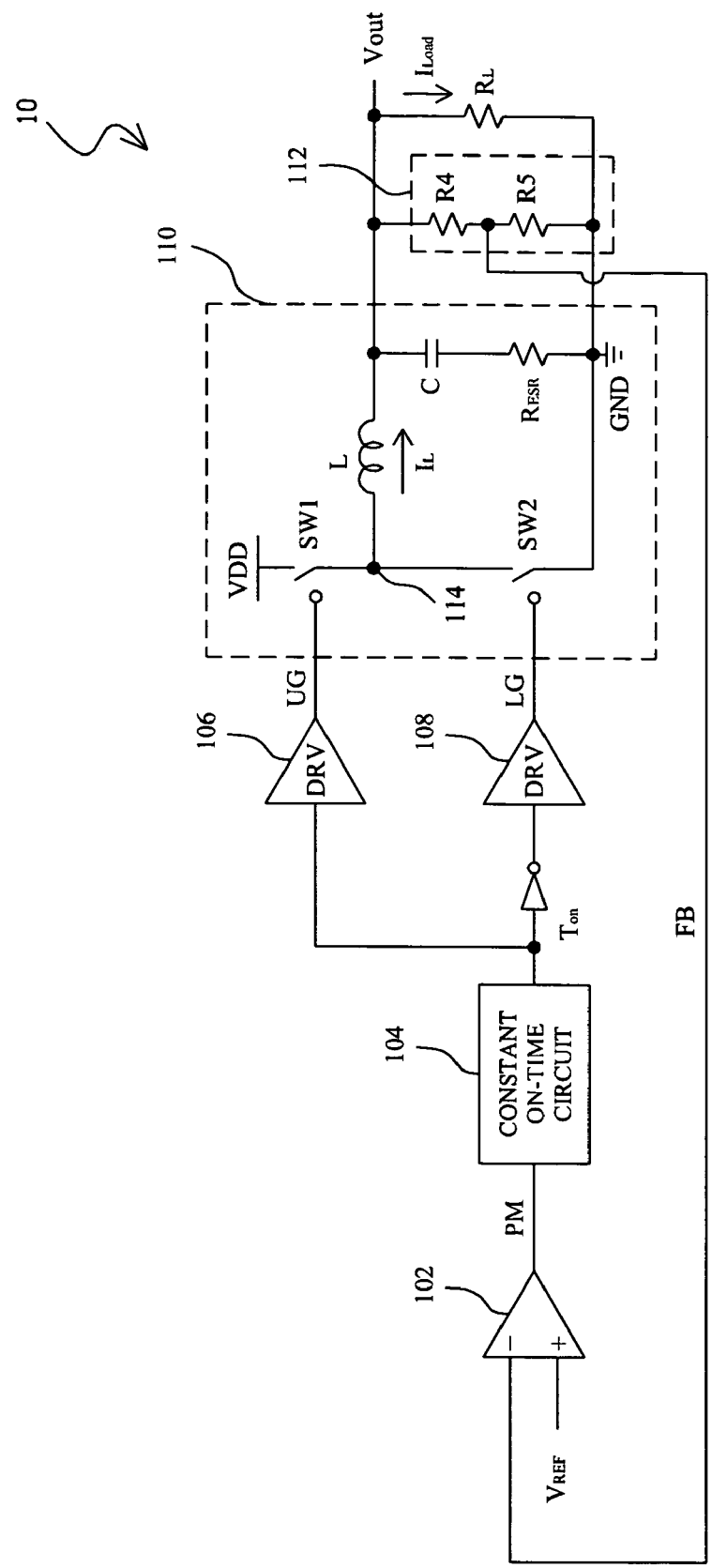
FIG. 1 shows a conventional variable-frequency PWM controller system.
Figure 2:
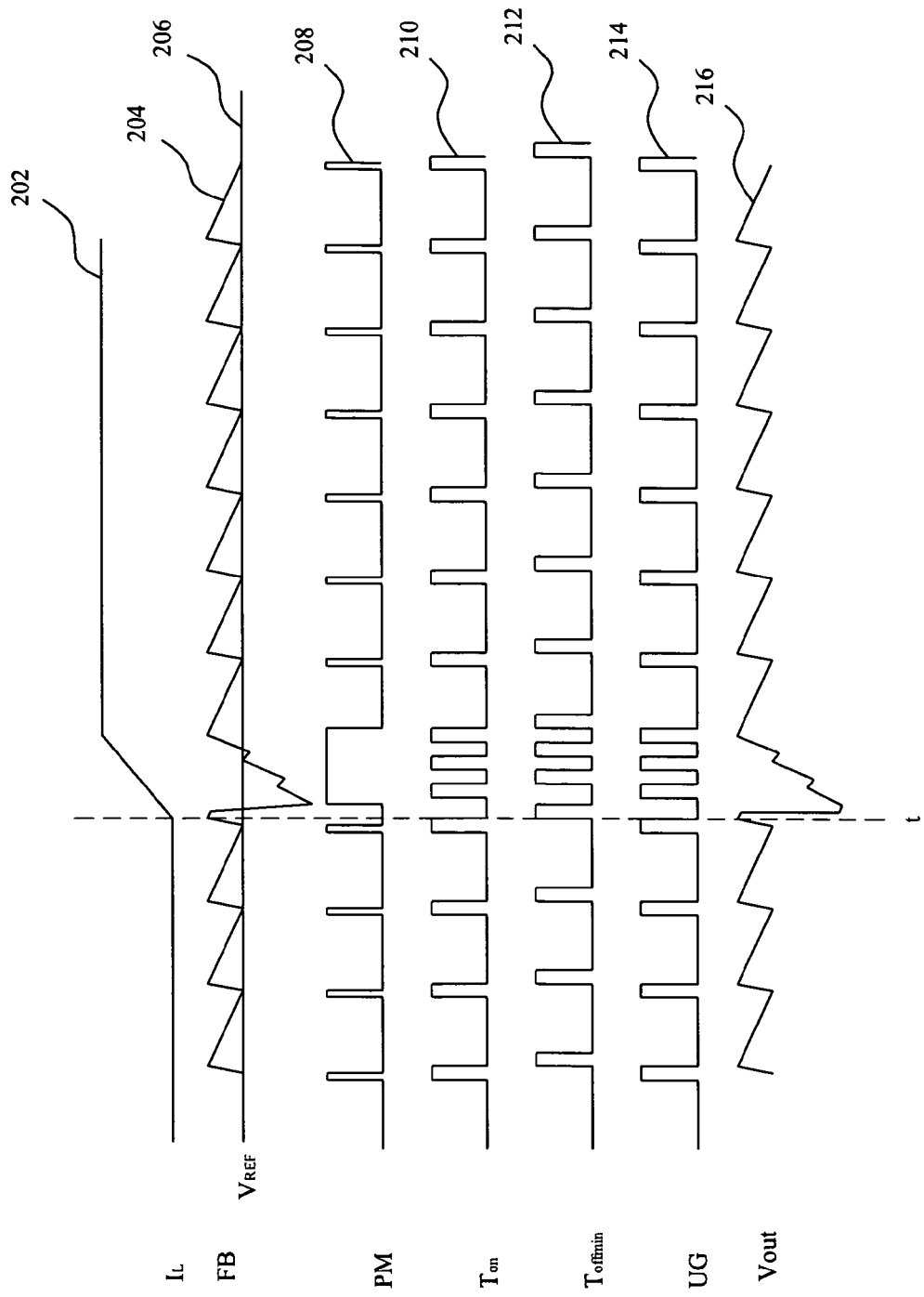
FIG. 2 shows a timing diagram of various signals in the circuit of FIG. 1 during a load transient.
Figure 3:
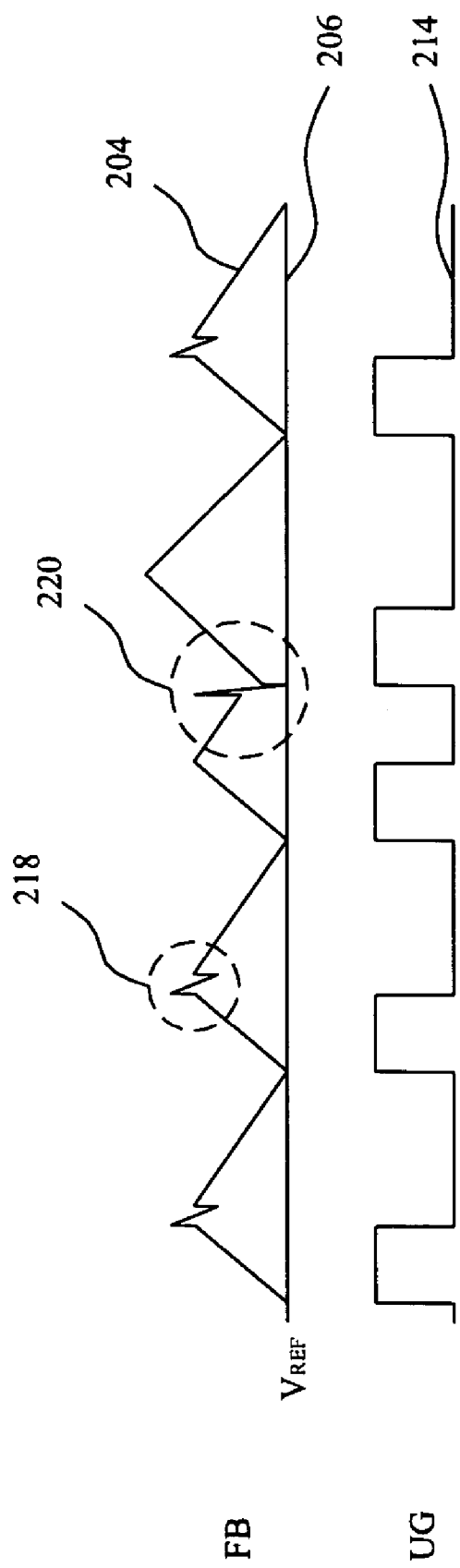
FIG. 3 shows a perspective diagram of noise interference to the switching system of FIG. 1.
Figure 4:
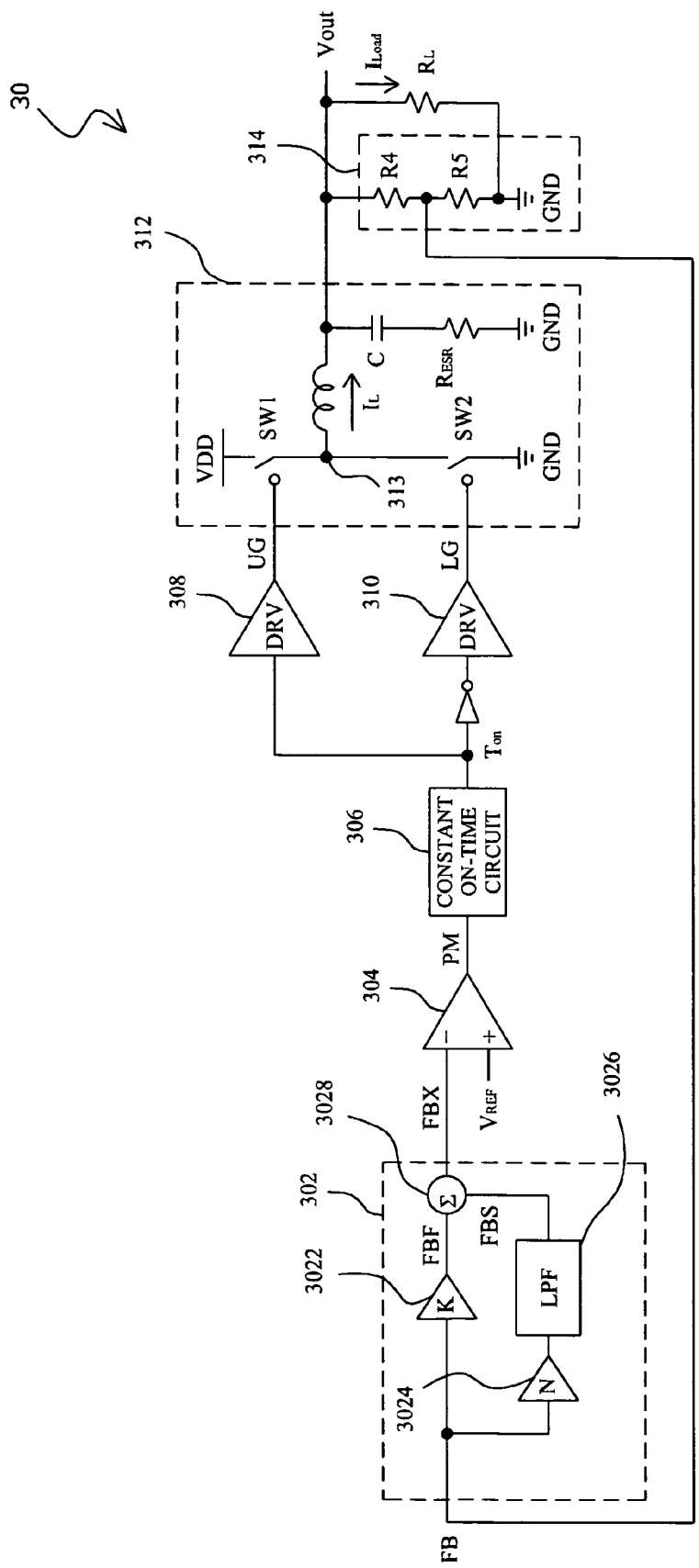
FIG. 4 shows the first embodiment according to the present invention.

FIG. 4 shows the first embodiment according to the present invention, in which a switching system 30 comprises an apparatus 302 for noise sensitivity improvement to the switching system 30, in addition to a comparator 304, a constant on-time circuit 306, two drivers 308 and 310, an output stage 312, and a voltage sense circuit 314. The output stage 312 includes a high-side switch SW1 connected between a supply voltage VDD and a phase node 313, a low-side switch SW2 connected between the phase node 313 and ground GND, an inductor L connected between the phase node 313 and an output Vout, and a capacitor C having an equivalent series resistance $R_{ESR}$ connected between the output Vout and ground GND. The voltage sense circuit 314 has two resistors R4 and R5 connected in series between the output Vout and ground GND, to sense the output voltage Vout of the switching system 30 to generate a feedback signal FB. The apparatus 302 generates a combined signal FBX according to the feedback signal FB. The comparator 304 compares the combined signal FBX with a reference VREF to generate a signal PM for the constant on-time circuit 306 to generate an on-time signal $T_{on}$, to control the drivers 308 and 310 to generate two driving signals UG and LG to drive the switches SW1 and SW2 to modulate the output voltage Vout.

In this embodiment, the apparatus 302 includes two amplifiers 3022 and 3024, a low-pass filter (LPF) 3026, and a summing circuit 3028. The amplifier 3022 amplifies the feedback signal FB by a gain K to generate a signal FBF, while the amplifier 3024 amplifies the feedback signal FB by a gain N to generate a signal filtered by the low-pass filter 3026 to generate a signal FBS. Since the signal FBF is obtained directly by amplifying the feedback signal FB, it may be still noisy. In contrast, the low-pass filter 3026 filters out the high-frequency noise from the amplified feedback signal, and the signal FBS is thus clear. The summing circuit 3028 combines the signals FBF and FBS to generate the combined signal FBX to the comparator 304.

Figure 5:
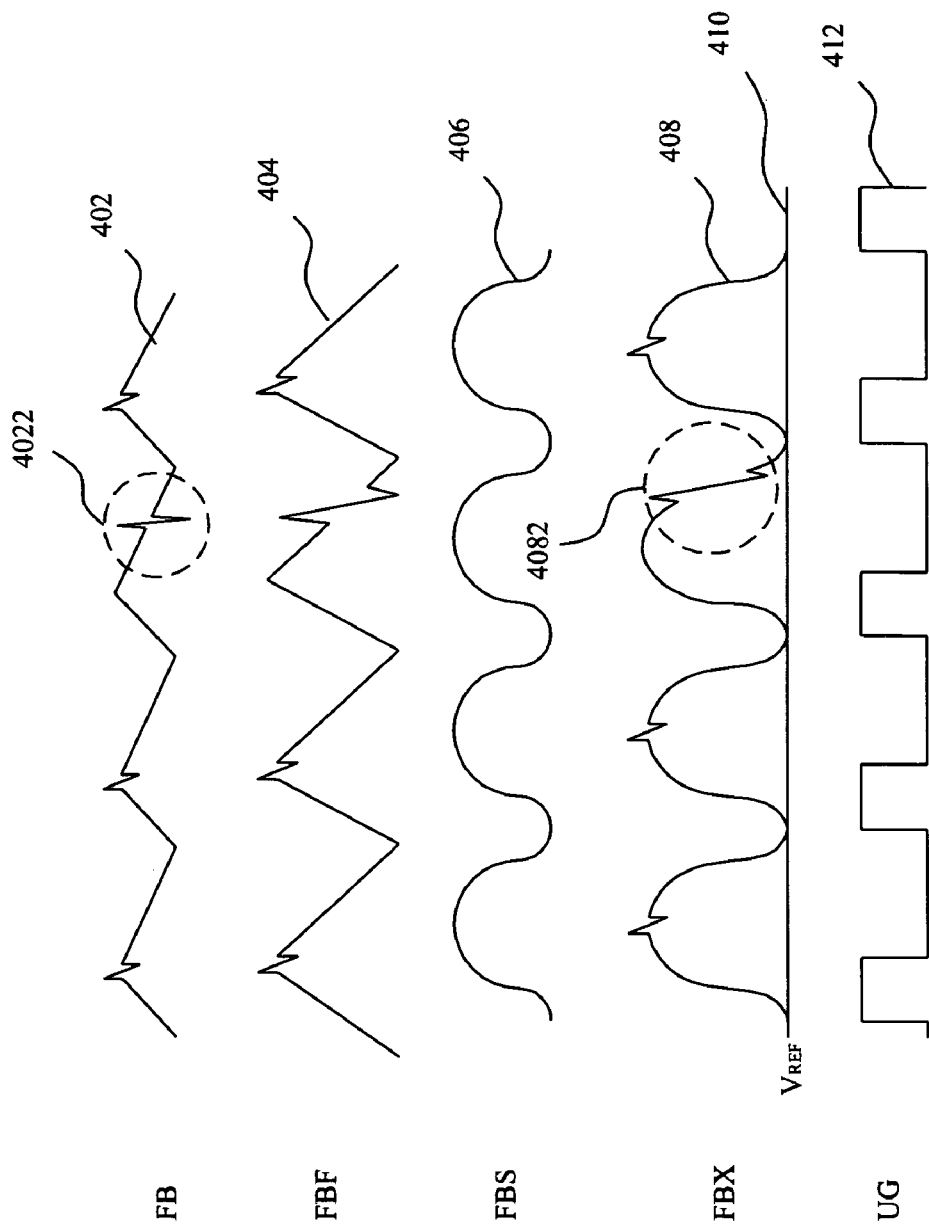
FIG. 5 shows a timing diagram of various signals in the circuit of FIG. 4.

FIG. 5 shows a timing diagram of various signals in the circuit 30 of FIG. 4, in which waveform 402 represents the feedback signal FB, waveform 404 represents the amplified signal FBF, waveform 406 represents the filtered amplified signal FBS, waveform 408 represents the combined signal FBX, waveform 410 represents the reference $V_{REF}$, and waveform 412 represents the high-side driving signal UG.

Referring to FIG. 4 and FIG. 5, in the apparatus 302, the amplifier 3022 amplifies the feedback signal FB together with the noise thereon by K times to generate the signal FBF, as shown by the waveform 404. On the other hand, the amplifier 3024 amplifies the feedback signal FB together with the noise thereon by N times, and the filter 3026 filters the amplified signal to remove the high-frequency noise thereon to generate the signal FBS, as shown by the waveform 406. The summing circuit 3028 combines the noisy signal FBF and the clear signal FBS to generate the combined signal FBX for the comparator 304 to compare with the reference $V_{REF}$, as shown by the waveforms 408 and 410. Since the signal FBS is filtered by the low-pass filter 3026, when the two signals FBF and FBS are combined together, the noise on the combined signal FBX will be that on the signal FBF but level shifted to higher only, without amplitude amplification. Therefore, the noise near the valley of the combined signal FBX is shifted away from the reference $V_{REF}$, as shown by portion 4082, and error operation is therefore avoided. As a result, the noise sensitivity of the switching system 30 is improved.

In the first embodiment, the signal FBS is a low frequency signal by filtered by the low pass filter 3026, and the other signal FBF is still a high frequency signal since it is amplified by the amplifier 3022 only. Therefore, the gain K of the amplifier 3022 is preferably larger than the gain N of the amplifier 3024, to maintain the switching system 30 having fast transient response.

Figure 6:
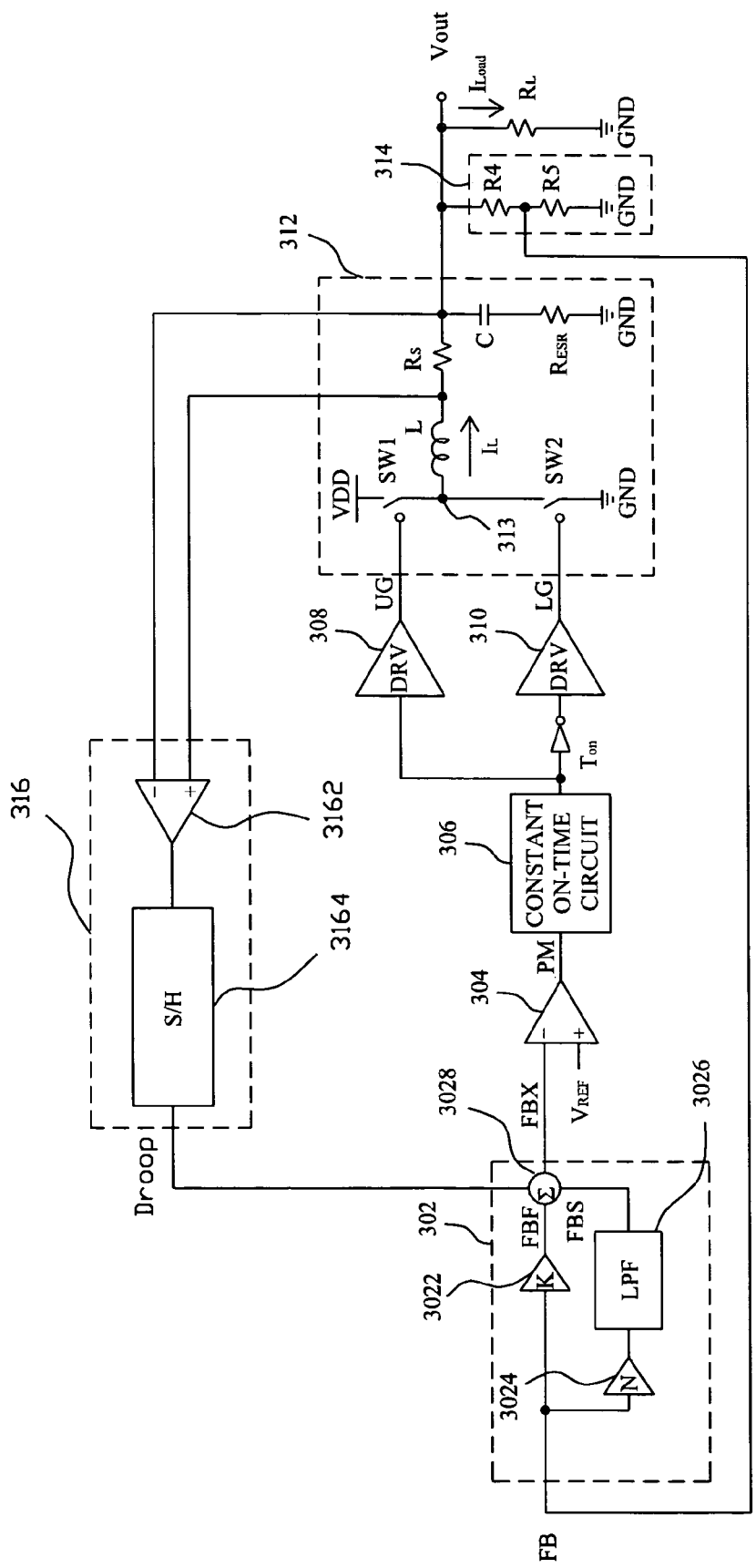
FIG. 6 shows a current sense circuit inserted additionally to the first embodiment according to the present invention.

Using transconductance to implement error amplifier has another advantage of droop import. A droop import circuit 316 may be inserted additionally to the circuit 30 of FIG. 4, and FIG. 6 shows such an embodiment, in which the droop import circuit 316 includes a transconductive amplifier 3162 shunt to a sense resistor $R_S$ connected between the inductor L and the output Vout to sense the inductor current $I_L$ by the voltage drop across the sense resistor $R_S$ to generate a current sense signal, and a sample and hold (S/H) circuit 3164 to sample and hold the current sense signal to generate a droop signal Droop to combine with the signals FBF and FBS by the summing circuit 3028. The S/H circuit 3164 filters the output ripple, and thus the output DC current level is injected to the inverting input of the comparator 304. The injected level will degrade the feedback signal FB and droop will be generated. In other words, the droop signal Droop is set to adjust the load regulation droop voltage. When the load $R_L$ changes, the droop signal Droop will adjust the level of the combined signal FBX to prevent the output voltage Vout from over-ripple that may cause the load $R_L$ malfunction or damaged.

Figure 7:
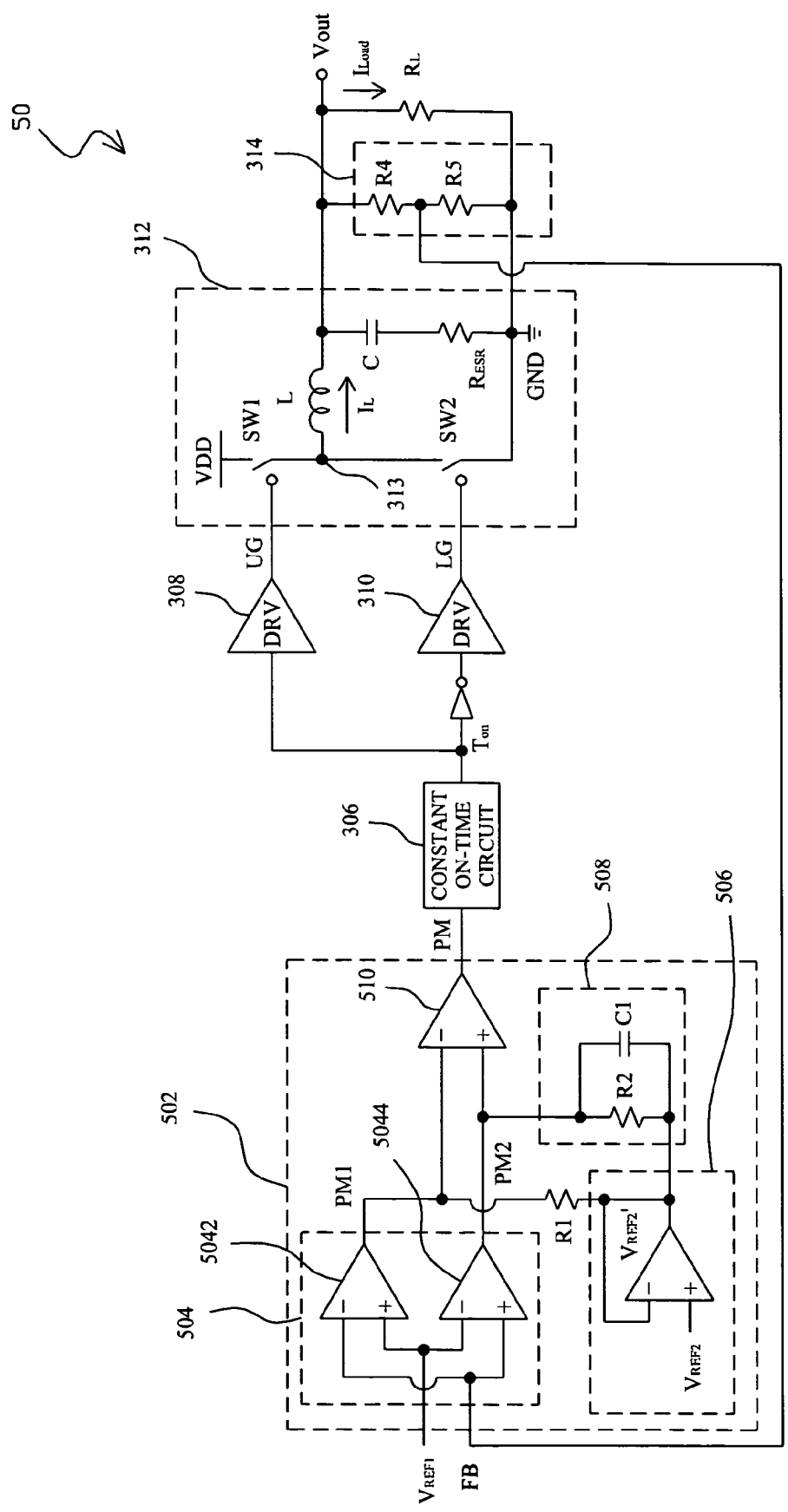
FIG. 7 shows the second embodiment according to the present invention.

FIG. 7 shows the second embodiment according to the present invention, in which, similar to the switching system 30 of FIG. 4, a switching system 50 comprises a constant on-time circuit 306, two drivers 308 and 310, an output stage 312, and a voltage sense circuit 314. However, the apparatus 502 for noise sensitivity improvement hereof comprises an amplifier circuit 504, a voltage generator 506, an RC filter 508, a comparator 510 and a resistor R1. The RC filter 508 includes a resistor R2 and a capacitor C1 connected in parallel, and the amplifier circuit 504 includes two substantially equivalent transconductive amplifiers 5042 and 5044. The transconductive amplifiers 5042 and 5044 transfer the differential of the feedback signal FB and the reference $V_{REF1}$ to output currents PM1 and PM2 and both the output currents PM1 and PM2 are inverted to each other due to their inverted inputs. The voltage generator 506 includes a voltage follower to provide a reference $V_{REF2}'$ from a reference $V_{REF2}$ connected through the resistors R1 and R2 to the outputs PM1 and PM2 of the amplifier circuit 504 that are connected to the inputs of the comparator 510 to generate the signal PM for the constant on-time circuit 306. R1 and R2 determine the transconductances of the transconductive amplifiers 5042 and 5044, and R2 and C1 determine the pole of the signal PM2. The pole may be set between the PWM controller operation frequency (about 200–600 kHz) and the noise frequency (about 10 MHz) to filter out the noise on the feedback signal FB. As a result, the signal PM2 will be clear by filtered by the RC filter 508, and in the signal PM 1 the feedback signal FB is directly amplified together with the noise thereon. Preferably, R1≧R2, i.e., PM1/FB≧PM2/FB, to ensure fast transient response. As a load transient occurs, the signal PM 1 will response fast, while the signal PM2 could not follow such fast transient due to the bandwidth limitation. R1≧R2, the signal PM1 will be lower than the signal PM2 in the load transient condition and the high-side driving signal UG will be turned on quickly. Therefore, the apparatus 502 will combine fast response and excellent noise immunity characteristics for the switching system 50.

Figure 8:
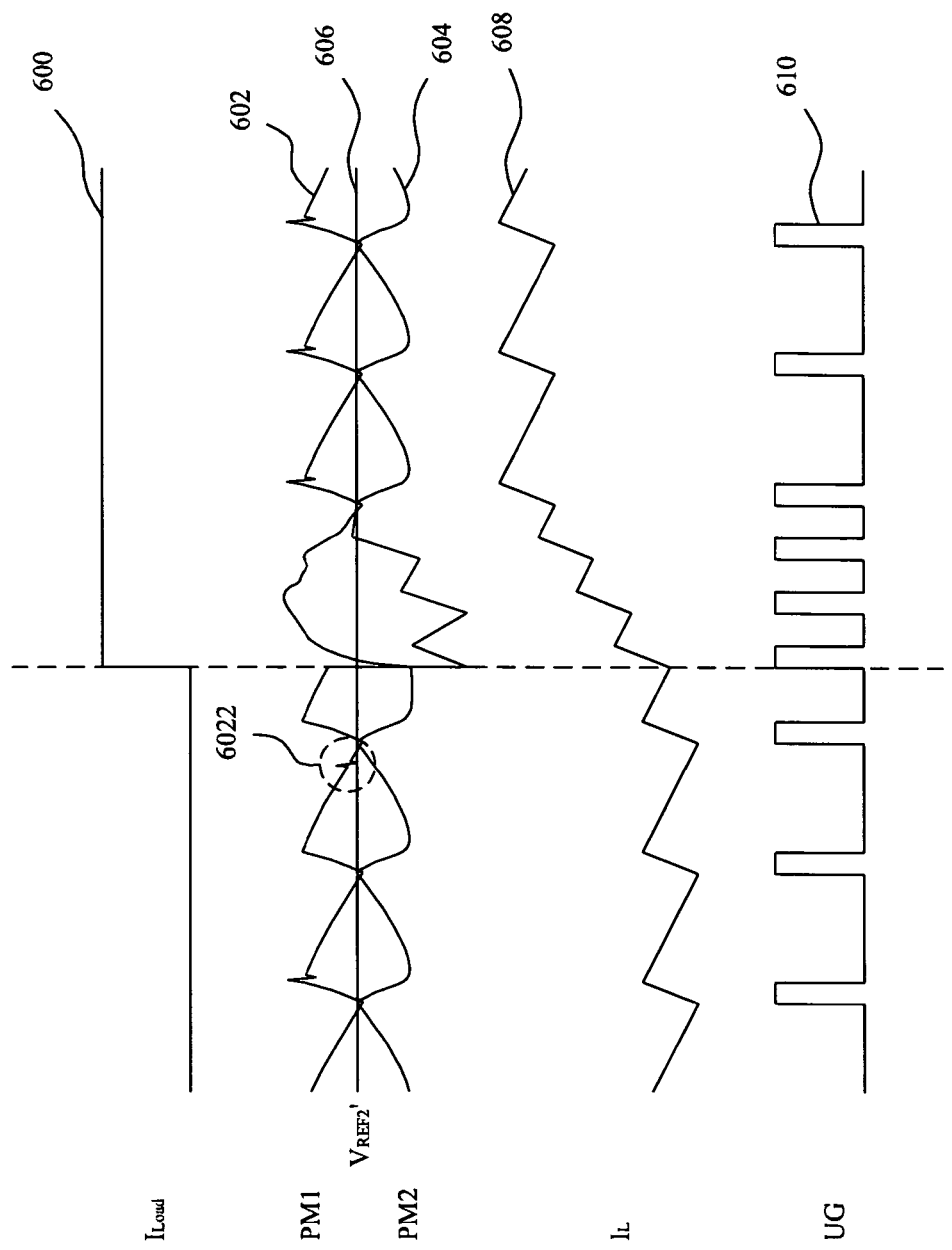
FIG. 8 shows a timing diagram of various signals in the circuit of FIG. 7.

FIG. 8 shows a timing diagram of various signals in the circuit of FIG. 7, in which waveform 600 represents the load current $I_{LOAD}$, waveform 602 represents the signal PM1, waveform 604 represents the signal PM2, line 606 indicates the level of the reference $V_{REF2}'$, waveform 608 represents the inductor current $I_L$, and waveform 610 represents the driving signal UG of the high-side switch SW1.

Referring to FIG. 7 and FIG. 8, when the signal PM1 is lower than the signal PM2, the output signal PM of the comparator 510 will trigger the constant on-time circuit 306 to generate the on-time signal $T_{on}$. Although the noise 6022 near the valley of the signal PM1 is lower than the reference $V_{REF2}'$, it will not interfere the operations of the switching system 50 since the signal PM1 is still higher than the signal PM2. At time t, a load transient is occurred in the switching system 50, and at this time, the signal PM1 drops rapidly in fast response to the dropped output voltage Vout and the signal PM2 begins to raise, such that the frequency of the driving signal UG for the high-side switch SW1 increases.

Figure 9:
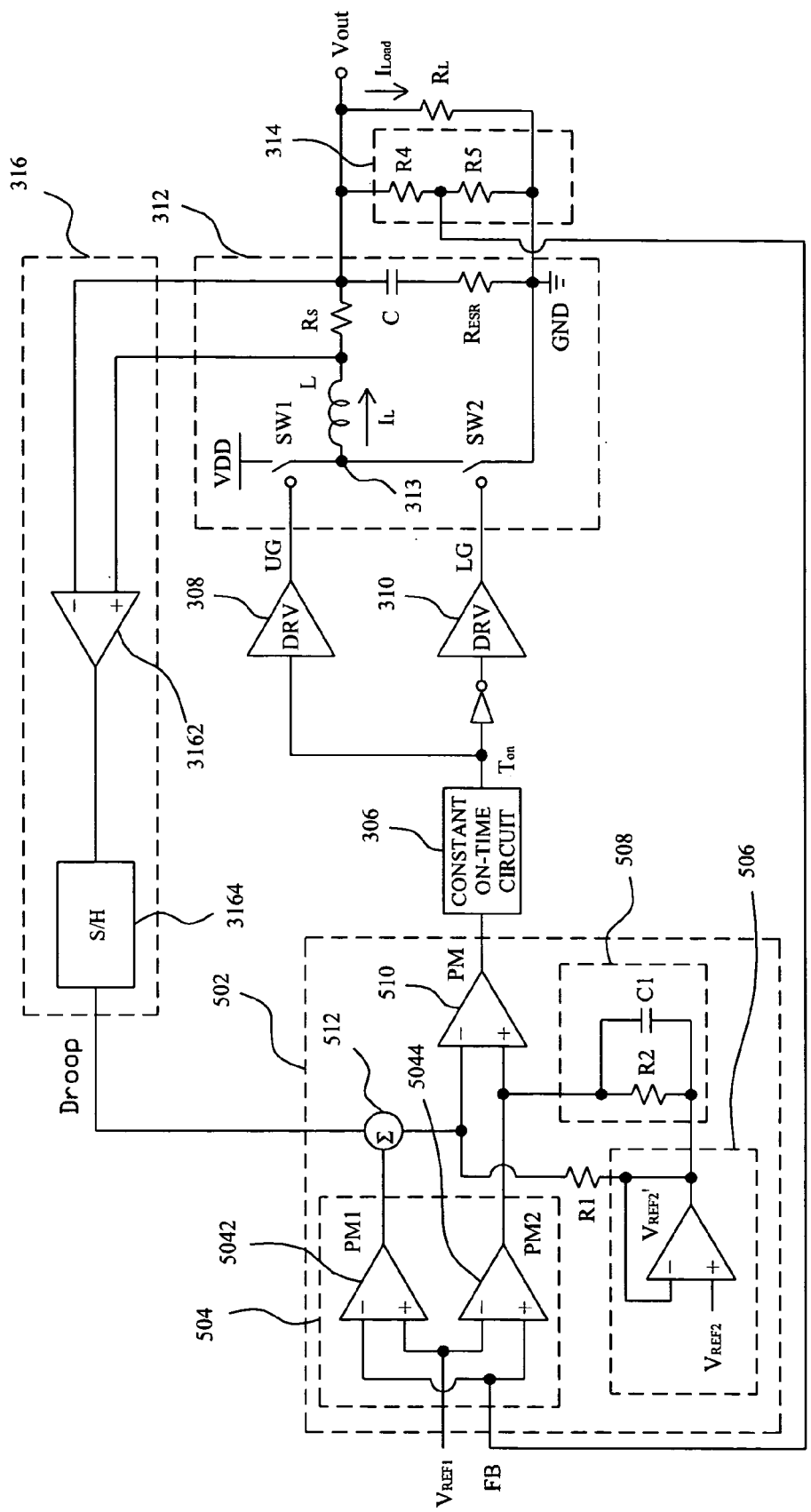
FIG. 9 shows a current sense circuit inserted additionally to the second embodiment according to the present invention.

Similarly, a droop import circuit 316 may be inserted additionally to the circuit 50 of FIG. 7, and FIG. 9 shows such an embodiment, in which the droop import circuit 316 includes a transconductive amplifier 3162 shunt to a sense resistor $R_S$ connected between the inductor L and the output Vout to sense the inductor current $I_L$ by the voltage drop across the sense resistor $R_S$ to generate a current sense signal, and a sample and hold (S/H) circuit 3164 to sample and hold the current sense signal to generate a droop signal Droop to combine with the signal PM1 by a summing circuit 512. The S/H circuit 3164 filters the output ripple, and thus the output DC current level is injected to the inverting input of the comparator 510. The droop signal Droop is set to adjust the load regulation droop voltage. When the load $R_L$ changes, the droop signal Droop will adjust the level of the signal PM1 to prevent the output voltage Vout from over-ripple that may cause the load $R_L$ malfunction or damaged. In other embodiments, the droop signal Droop may be combined with the signal PM2, instead of with the signal PM1.

Figure 10:
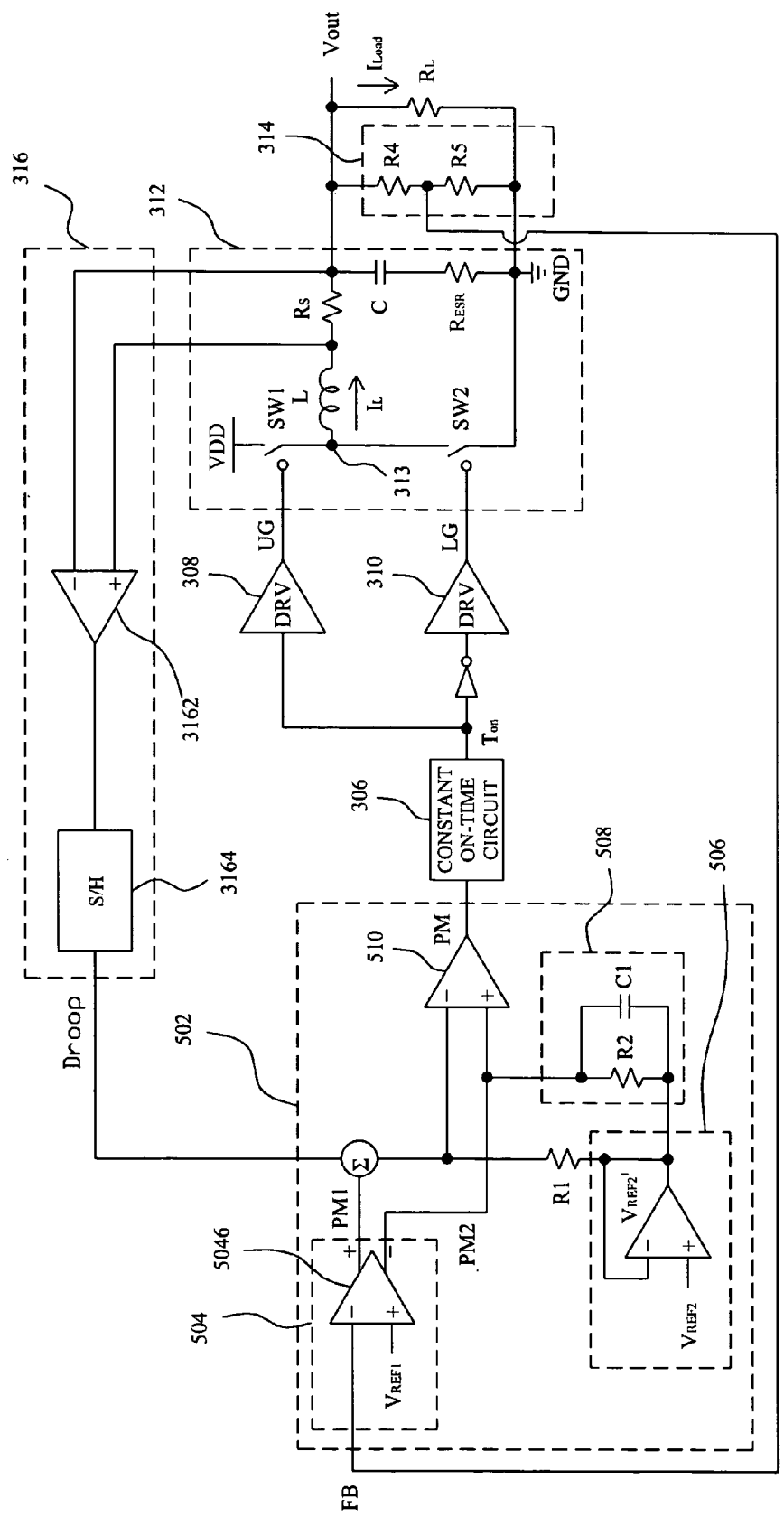
FIG. 10 shows the third embodiment according to the present invention.
Figure 11:
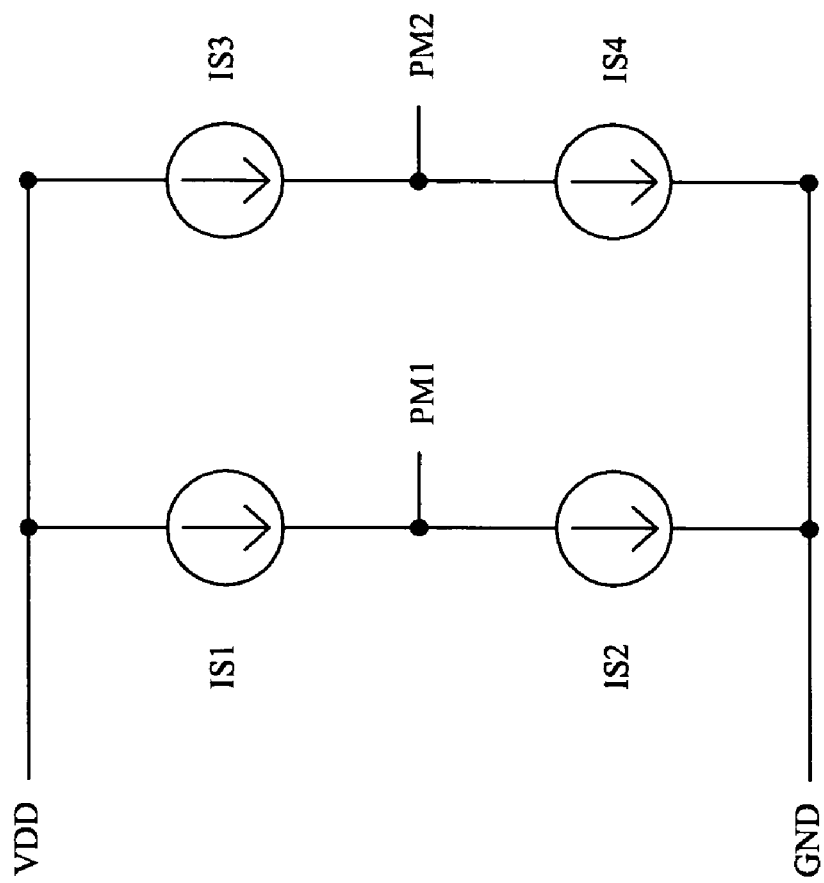
FIG. 11 shows an embodiment for the two-output transconductive amplifier in FIG. 10.

Applying current mirror skill could combine two transconductive amplifiers to a single transconductive amplifier with two outputs inverted to each other. Particularly, the circuits shown in FIG. 7 and FIG. 9 may be modified by replacing the amplifier circuit 504 with a two-output transconductive amplifier 5046, as shown in FIG. 10, which has two inputs connected with the feedback signal FB and the reference $V_{REF1}$ and generates the signals PM1 and PM2 accordingly at its two outputs. FIG. 11 shows the output stage perspective for the two-output transconductive amplifier 5046, which has two current sources IS1 and IS2 connected between the supply voltage VDD and ground GND, with the node therebetween to derive the signal PM1, and another two current sources IS3 and IS4 connected between the supply voltage VDD and ground GND, with the node therebetween to derive the signal PM2. The current sources IS1 and IS4 are set to generate substantially equivalent current I1, and the other two current sources IS2 and IS3 are set to generate substantially equivalent current I2, thereby the output signals PM1 and PM2 inverted to each other. In other words, it could use only one transconductive amplifier to amplify the ripple of the feedback signal FB and filter the noise thereon at the same time. By use of a single transconductive amplifier 5046 as shown in FIG. 10, instead of two transconductive amplifiers 5042 and 5044 as shown in FIG. 9, to amplify the differential of the feedback signal FB and the reference $V_{REF1}$, the problem resulted from offset between the two transconductive amplifiers 5042 and 5044 is avoided.

Figure 12:
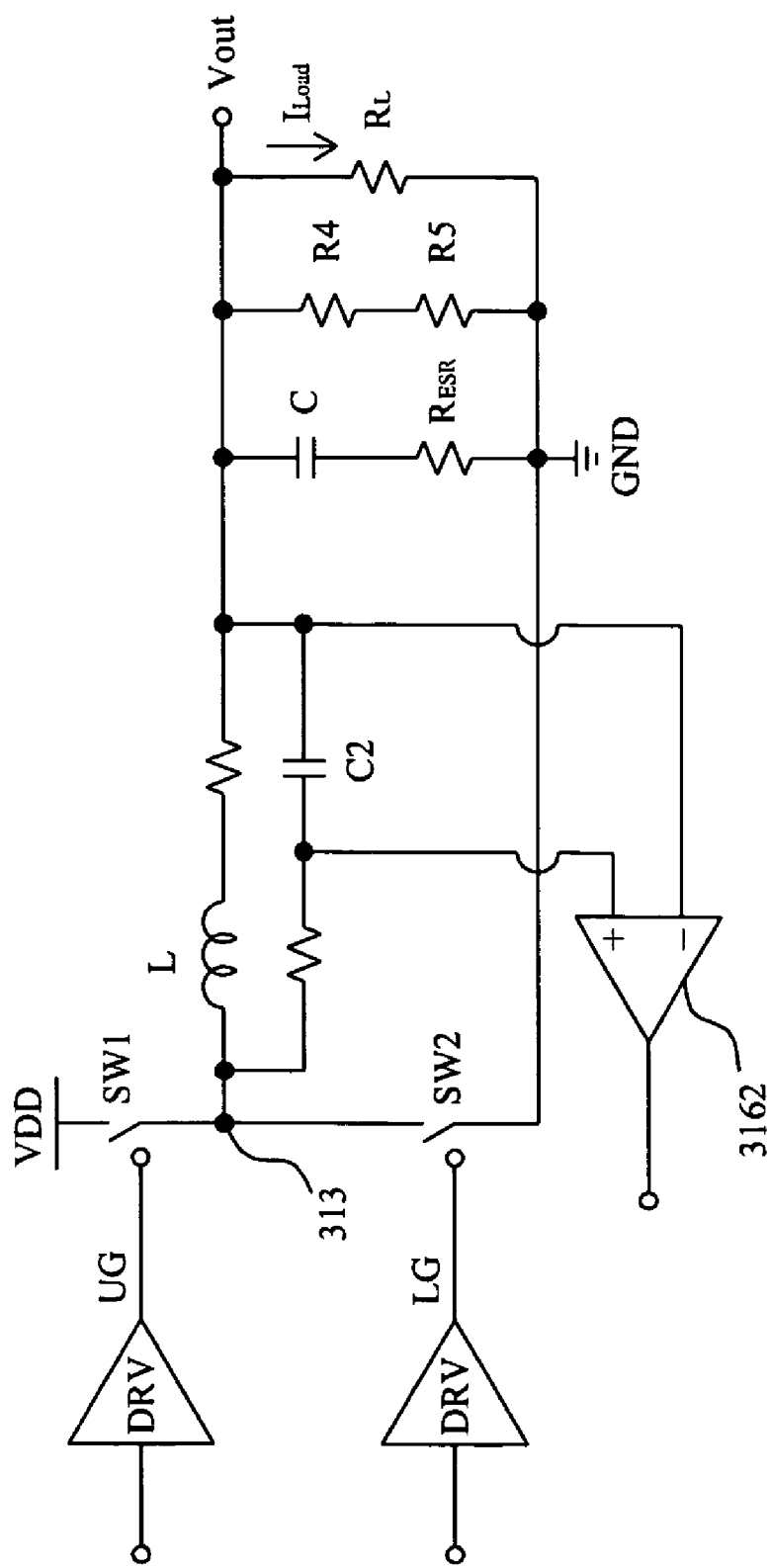
FIG. 12 shows a scheme to sense the inductor current.
Figure 13A:
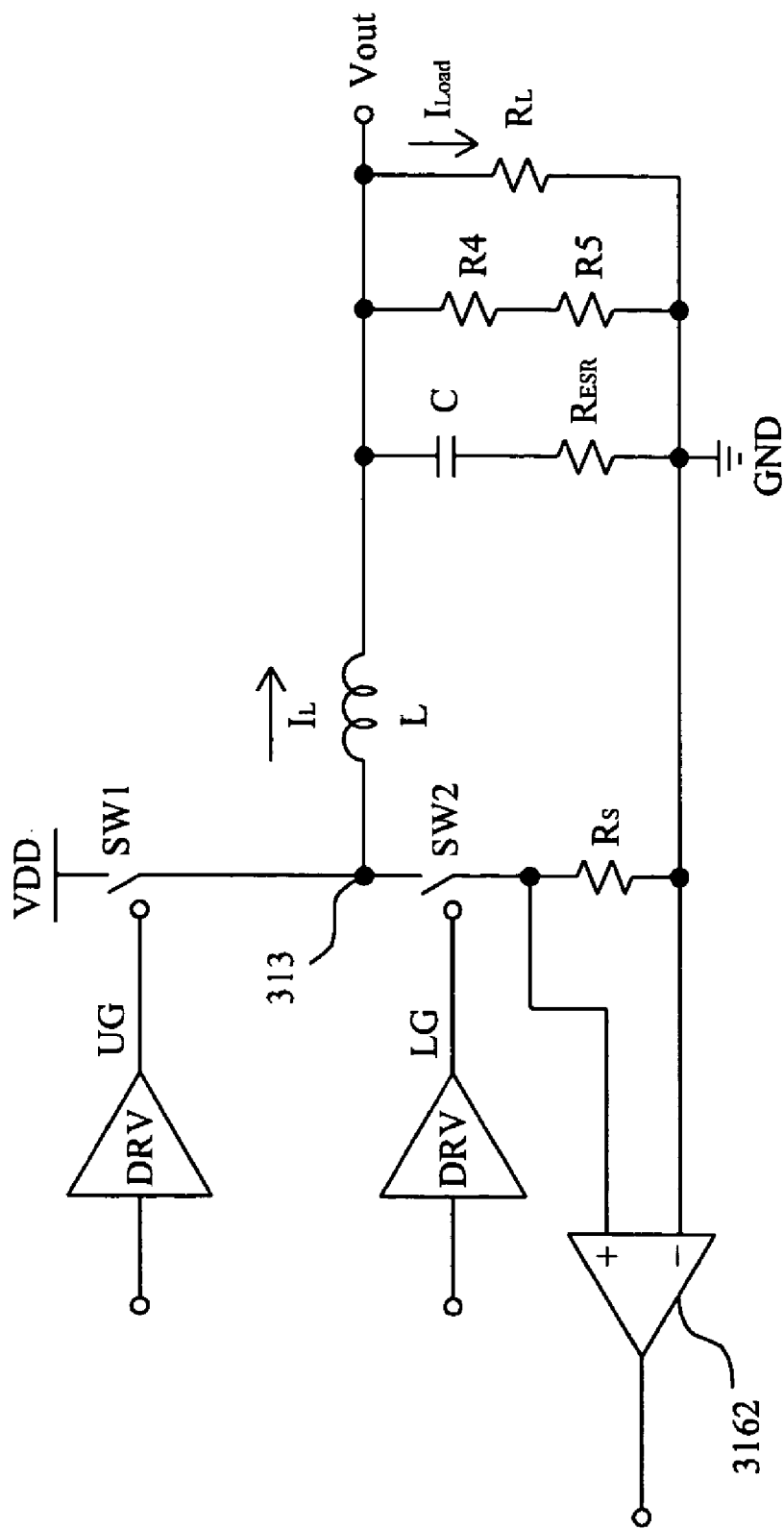
FIG. 13A shows another scheme to sense the inductor current.
Figure 13B:
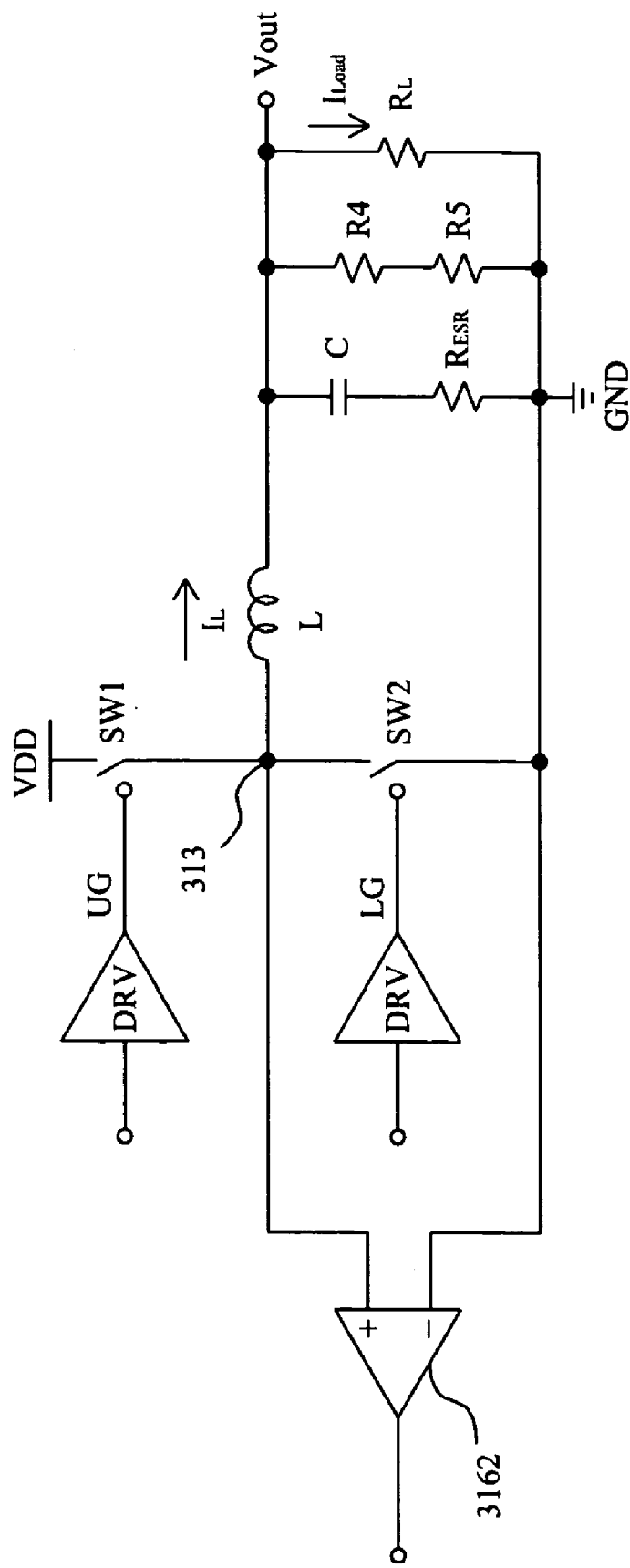
FIG. 13B shows still another scheme to sense the inductor current.
Figure 14A:
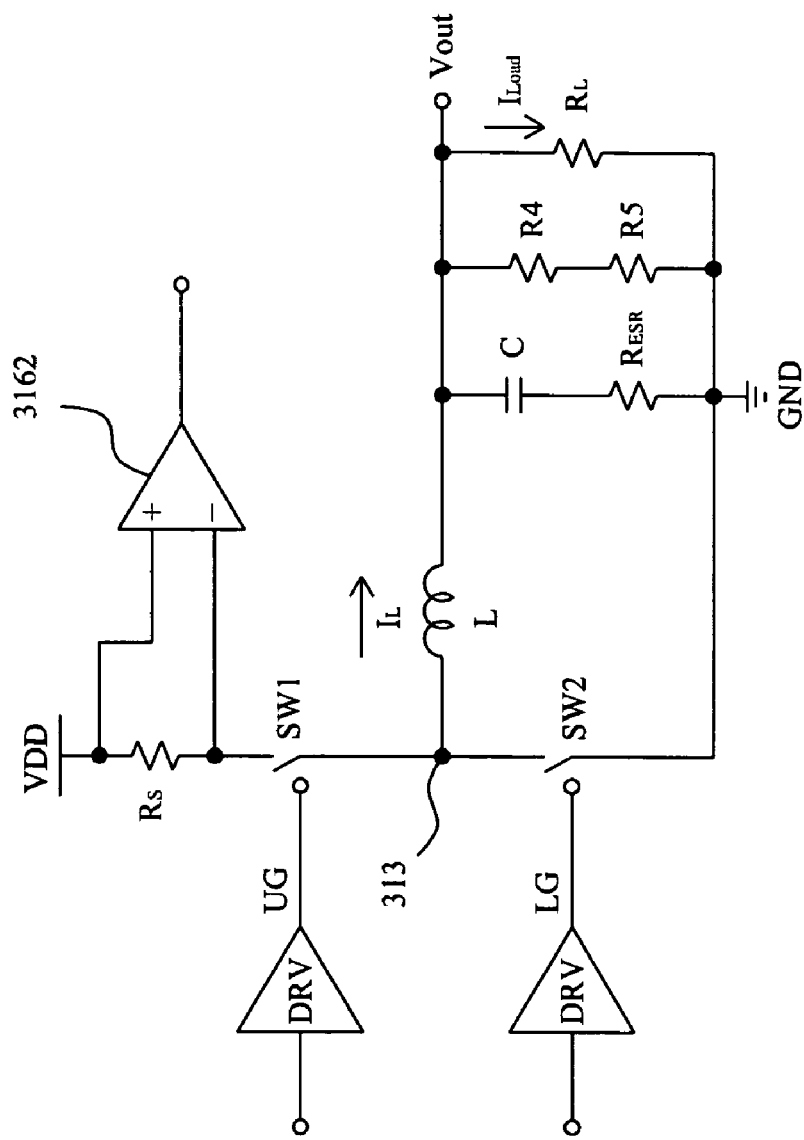
FIG. 14A shows yet another scheme to sense the inductor current.
Figure 14B:
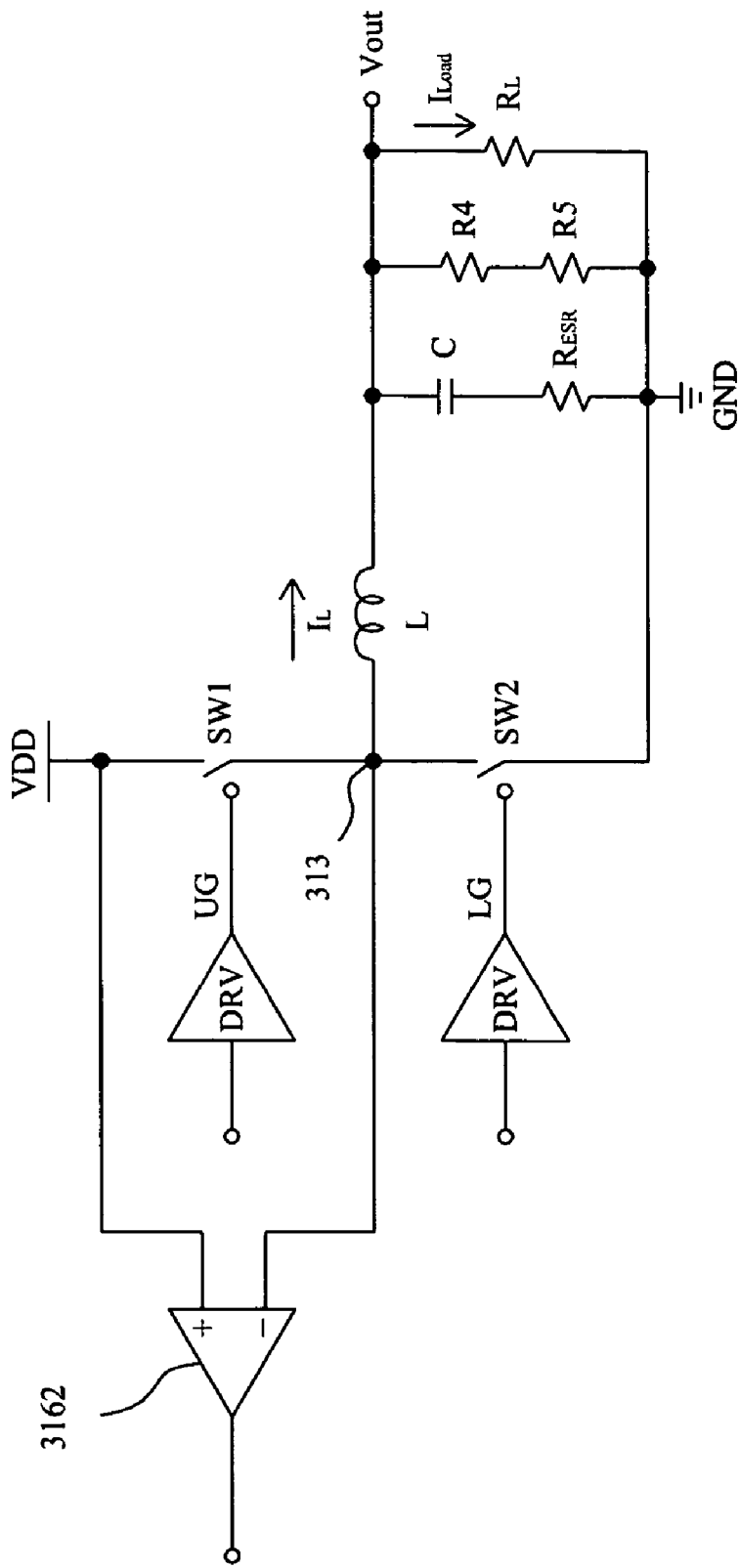
FIG. 14B shows still yet another scheme to sense the inductor current.

FIG. 12 to FIG. 14 show various schemes to sense the inductor current $I_L$. In FIG. 12, a capacitor C2 is shunt to the inductor L as a sense device. In FIG. 13A, the sense resistor $R_S$ is connected between the low-side switch SW2 and ground GND. In FIG. 13B, the equivalent resistor of the low-side switch SW2 is serving as the sense resistor, and thus the voltage drop across the low-side switch SW2 is directly sensed. In FIG. 14A, the sense resistor $R_S$ is connected between the supply voltage VDD and the high-side switch SW1. In FIG. 14B, the equivalent resistor of the high-side switch SW1 is serving as the sense resistor, and thus the voltage drop across the high-side switch SW1 is directly sensed.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An apparatus for noise sensitivity improvement to a switching system including a comparator to generate a comparator signal to drive an output stage to generate an inductor current to derive an output voltage, and a voltage sense circuit to sense said output voltage to generate a feedback signal, said apparatus comprising:
   a first amplifier having a first gain for amplifying said feedback signal to generate a first signal;
   a second amplifier having a second gain for amplifying said feedback signal to generate a second signal;
   a filter for filtering said second signal; and
   a summing circuit for combining said first signal and said filtered second signal to generate a third signal to said comparator, said third signal including a level shifted version of a noise component when present in said feedback signal.

2. The apparatus according to claim 1, wherein said first gain is substantially larger than said second gain.

3. The apparatus according to claim 1, further comprising a droop import circuit for generating a droop signal from said inductor current connected to said summing circuit to adjust a load regulation droop voltage.

4. A method for noise sensitivity improvement to a switching system including a comparator to generate a comparator signal to drive an output stage to generate an inductor current to derive an output voltage, and a voltage sense circuit to sense said output voltage to generate a feedback signal, said method comprising the steps of:
   respectively amplifying said feedback signal by a first gain and a second gain for generating a first signal and a second signal;
   filtering said second signal; and
   combining said first signal and said filtered second signal for generating a third signal to said comparator, said third signal including a level shifted version of a noise component when present in said feedback signal.

5. The method according to claim 4, wherein said first gain is substantially larger than said second gain.

6. The method according to claim 4, further comprising generating a droop signal from said inductor current to be further combined to said combined first signal and said filtered second signal to adjust a load regulation droop voltage.

7. An apparatus for noise sensitivity improvement to a switching system to generate an inductor current to derive an output voltage by driving an output stage with a comparator signal, and a voltage sense circuit to sense said output voltage to generate a feedback signal, said apparatus comprising:
   an amplifier circuit for respectively amplifying a differential of said feedback signal and a first reference by a first gain and by a second gain to generate a first signal and a second signal with a phase difference to said first signal;
   a voltage generator for providing a second reference for level shifting of said first and second signals;
   a filter for filtering said level-shifted second signal; and
   a comparator for comparing said level-shifted first signal with said filtered level-shifted second signal to generate said comparator signal.

8. An apparatus according to claim 7, wherein said amplifier circuit comprises:
   a first transconductive amplifier for amplifying said differential to generate said first signal; and
   a second transconductive amplifier for amplifying said differential to generate said second signal.

9. The apparatus according to claim 7, wherein said amplifier circuit comprises a two-output transconductive amplifier for amplifying said differential to generate said first and second signals.

10. The apparatus according to claim 7, wherein said filter comprises an RC circuit for determining said second gain and a pole of said second signal.

11. The apparatus according to claim 10, further comprising a second resistor connected between said first signal and said second reference for determining said first gain.

12. The apparatus according to claim 11, wherein said second resistor has a resistance substantially larger than that of said first resistor.

13. The apparatus according to claim 7, further comprising a droop import circuit for generating a droop signal from said inductor current to be further combined to said first signal or said second signal to adjust a load regulation droop voltage.

14. A method for noise sensitivity improvement to a switching system to generate an inductor current to derive an output voltage by driving an output stage with a comparator signal, and a voltage sense circuit to sense said output voltage to generate a feedback signal, said method comprising the steps of:
   respectively amplifying a differential of said feedback signal and a first reference by a first gain and by a second gain for generating a first signal and a second signal with a phase difference to said first signal;
   providing a second reference for level shifting of said first and second signals;
   filtering said level-shifted second signal; and
   comparing said level-shifted first signal with said filtered level-shifted second signal to generate said comparator signal.

15. The method according to claim 14, wherein said first gain is substantially larger than said second gain.

* * * * *